US008253485B2

(12) United States Patent
Clifton

(10) Patent No.: US 8,253,485 B2
(45) Date of Patent: Aug. 28, 2012

(54) POWER AMPLIFIER

(75) Inventor: John Christopher Clifton, Hampshire (GB)

(73) Assignee: Sony Europe Limited, Weybridge Surrey (GB)

( * ) Notice: Subject to any disclaimer, the term of this patent is extended or adjusted under 35 U.S.C. 154(b) by 0 days.

(21) Appl. No.: 13/015,024

(22) Filed: Jan. 27, 2011

(65) Prior Publication Data

US 2011/0241782 A1 Oct. 6, 2011

(30) Foreign Application Priority Data

Mar. 31, 2010 (GB) .................................. 1005496.3

(51) Int. Cl.
*H03F 1/14* (2006.01)
*H03F 3/16* (2006.01)

(52) U.S. Cl. ......................................... 330/51; 330/277

(58) Field of Classification Search .................. 330/277, 330/310, 311
See application file for complete search history.

(56) References Cited

U.S. PATENT DOCUMENTS

| | | | | |
|---|---|---|---|---|
| 6,137,367 A | 10/2000 | Ezzedine et al. | | |
| 6,215,355 B1 | 4/2001 | Meck et al. | | |
| 7,215,206 B2 * | 5/2007 | Dupuis et al. | ................. | 330/311 |
| 8,131,251 B2 * | 3/2012 | Burgener et al. | ............. | 455/333 |
| 2002/0180530 A1 | 12/2002 | Buer et al. | | |
| 2008/0315954 A1 | 12/2008 | Staszewski et al. | | |

FOREIGN PATENT DOCUMENTS

WO WO 01/43280 6/2001

OTHER PUBLICATIONS

John Christopher Clifton et al., "Novel Multimode J-pHEMT Front-End Architecture With Power-Control Scheme for Maximum Efficiency", IEEE Transactions on Microwave Theory and Techniques, vol. 53, No. 6, Jun. 2005, pp. 2251-2258.

Julian Hildersley, Cutting 4G Handset RF Front Ends Down to Size, Wireless Design & Development, http://www.wirelessdesignmag.com/ProductNews.aspx?Cat=10&SubCat=1&ProdCode=J0080&ATLC=1001272&ATLK=336640&CommonCount=0, Jan. 2009, 2 Pages.

United Kingdom Search Report issued Jul. 29, 2010, in Great Britain 1005496.3, filed Mar. 31, 2010.

European Search Report issued on Apr. 14, 2011 in corresponding European Application No. 11 25 0063.

J. C. Clifton et al., "RFIC Antenna Switch Solutions for GSM Dualband Telephones", The Institution of Electrical Engineers, May 5, 1998, XP 006504409, pp. 4/1-4/4.

* cited by examiner

*Primary Examiner* — Steven J Mottola

(74) *Attorney, Agent, or Firm* — Oblon, Spivak, McClelland, Maier & Neustadt, L.L.P.

(57) ABSTRACT

A power amplifier comprises a series stack of power amplifier devices, connected in parallel to the amplifier input for receiving an RF input signal, and having output terminals being connected in series to the amplifier output. An intermediate coupling capacitor is connected between each adjacent pair of power amplifier devices in the series stack of power amplifier devices for DC isolation of said power amplifier devices. This reduces the required DC supply voltage, as well as allowing shorting of individual power amplifier devices in response to variation in the DC supply voltage.

16 Claims, 6 Drawing Sheets

60
42
41
43
44
45
46
47
48
Rx
PA module
40
High band
Low band
Envelope tracking supply control
51
52
12
1a
1b
50
RF IC
49

POWER AMPLIFIER

CROSS-REFERENCE TO RELATED APPLICATIONS

This application is based upon and claims the benefit of priority from British Application No. 10054963 filed 31 Mar. 2010, the entire contents of which are incorporated by reference.

BACKGROUND OF THE INVENTION (1) Field of the Invention

The present invention relates to radio frequency (RF) transmission in portable telecommunication devices and specifically to power amplifiers for amplifying RF signals for transmission.

(2) Description of Related Art

As portable telecommunication devices are developed, the number of frequency bands in usage is increasing rapidly. Many 3G standards have been developed, characterised by ever-increasing numbers of frequency bands. The number of frequency bands is further increasing as 4G standards are developed and implemented.

Components for portable telecommunication devices are typically designed to be capable of operation in multiple different frequency bands. This is to allow operation in the appropriate frequency band anywhere in the world, as well as to achieve savings in design and manufacture by utilising a common design.

The front end of such devices includes a power amplifier for amplifying an RF signal to provide sufficient power for transmission. Such power amplifiers are intrinsically narrowband devices. The need to generate power from a power supply, such as a battery, that provides a relatively small DC voltage leads to the use of semiconductor devices of relatively high capacitance. Such a combination of a small supply voltage and a high capacitance leads to the power amplifiers being of low impedance and high Q-factor, thus limiting the bandwidth. The present invention is concerned with designs of power amplifiers that maximise the bandwidth of the power amplifier.

Another issue with power amplifiers is efficiency, because power amplifiers contribute a significant proportion of the power consumption of a mobile telecommunications device. This is particularly the case with the complex modulation schemes used in 3G/4G standards to increase data rates. Such schemes require linear power amplification that compromises overall system efficiency, for example requiring power amplifiers to be backed off from saturated maximum power.

In order to improve the bandwidth performance of a power amplifier, one approach is to increase the DC voltage used for driving the power amplifier. The voltage applied across an individual semiconductor device is limited by the physical material properties of the semiconductor as high voltages can cause breakdown.

Clifton et al., "Novel Multimode JpHEMT Front-end Architecture With Power-Control Scheme For Maximum Effeciency", IEEE Transactions on Microwave Theory and Techniques, Vol. 53, No. 6, June 2005 discloses a power amplifier performed by a series stack of separate JPHEMT devices. The same RF input signal is supplied in parallel to the input terminal of each JPHEMT device, and the output terminals of the JPHEMT devices are connected in series to provide the amplified RF output signal. Due to the arrangement of the JPHEMT devices in a series stack, each one is subjected to a fraction of the overall DC bias voltage. Thus, breakdown of the semiconductor material in the individual JPHEMT devices is avoided.

Nonetheless, the power amplifier may be operated with a relative high overall DC supply voltage which provides a number of advantages, as follows. The increased voltage improves the bandwidth of the power amplifier, as compared to using a single JPHEMT device. In practical systems, this allows a single power amplifier to cover an increased number of RF bands, thereby reducing the number of power amplifiers required in a multi-band telecommunications device. The design also improves the efficiency by providing a higher gain and allowing operation further from the knee voltage. The power amplifier may also be implemented in a reduced area of semiconductor because the higher voltage operation improves the output power per unit area of semiconductor geometry. For example, the overall gate width of the power amplifier disclosed in Clifton et al. is 7.2 mm as compared to a gate width of 18 mm for a conventional 3V power amplifier.

Portable telecommunication devices typically operate from batteries having an output voltage that is constrained by the battery technology. The output voltage will also have a discharge characteristic in which the output voltage reduces over the discharge of the battery. In view of these constraints, a nominal DC power supply voltage in a portable telecommunications device might be of the order of 3V. In order to provide a higher voltage than is available from the battery, Clifton et al. discloses the use of a DC-DC converter to provide an increased DC bias voltage supply for the power amplifier.

Another issue in portable telecommunication devices is the discharge characteristic of batteries typically used as a power supply. In particular, the output voltage of the battery reduces non-linearly over the discharge of the battery, for example along a characteristic from 4.2V to 2.5V. Where the DC bias voltage is fixed, this issue may be dealt with by designing components to operate at a nominal bias voltage, for example 3.0V. When the actual output voltage of the battery is above the nominal output voltage, then the efficiency of the components is compromised, because the power derived from the actual DC bias voltage in excess of the nominal output voltage is effectively wasted. This impacts on the power consumption. Conversely, there is an impact on battery life as the battery may be considered to be discharged when the output voltage falls below the nominal bias voltage. Accordingly, the nominal bias voltage is typically set to provide a compromise between these two factors, for example at 3.0 or 3.5V.

BRIEF SUMMARY OF THE INVENTION

According to a first aspect of the present invention, there is provided a power amplifier for amplifying an RF input signal, the power amplifier comprising:

an amplifier input for receiving the RF input signal, and an amplifier output for outputting an amplified RF output signal;

a series stack of power amplifier devices, each arranged to amplify a signal supplied to an input terminal thereof and to generate an amplified signal across two output terminals thereof, the input terminals of each power amplifier being connected in parallel to the amplifier input for receiving the RF input signal, and the output terminals of the power amplifier devices being connected in series to the amplifier output; and a respective intermediate coupling capacitor connected between the output terminals of each adjacent pair of power amplifier devices in said series stack of power amplifier devices for DC isolation of said power amplifier devices, the output terminals of each power amplifier device being connected to respective DC bias voltage supply lines, wherein, in respect of at least one of the power amplifier devices, the respective DC bias voltage supply lines to which the output terminals are connected include a switch arrangement capable of disconnecting the DC bias voltage, and the respective DC bias voltage supply line to which the input terminal is connected is itself connected to a variable DC bias voltage supply capable of being controlled to provide a normal DC bias voltage or a high DC bias voltage.

Thus a series stack of power amplifier devices is provided within a power amplifier. The input terminals of each power amplifier are connected in parallel to the amplifier input and so receive the same RF input signal. The output terminals of the power amplifier devices are connected in series to the amplifier output to together provide the amplified RF output signal. Thus, the power amplifier device in accordance with the present invention provides similar advantages to those discussed above with reference to Clifton et al.

In addition, an intermediate coupling capacitor is connected between the output terminals of each adjacent pair of power amplified devices in the series stack. This is for providing DC isolation of the power amplifier devices. Consequently, the output terminals of each power amplified device are connected to respective DC voltage supply lines. The DC isolation provided by the intermediate coupling capacitors allows a separate DC bias voltage supply to be provided for each power amplifier device. This means that a DC bias voltage of a reduced level is required as compared to a series stack without intermediate coupling capacitors, as in Clifton et al. This reduced requirement for the DC bias voltage is advantageous. In many practical embodiments, this allows the power amplifier to be operated from batteries without the need for a DC-DC converter, which reduces the cost and complexity of the power amplifier, whilst still providing the operational advantages from the use of a series stack of power amplifier devices.

Furthermore, the intermediate coupling capacitors of the present invention allow selectively shorting out of individual power amplifier devices, in particular by control of the DC bias voltages supplied thereto. This may be achieved by, in respect of at least one of the power amplifier devices, the respective DC bias voltage supply lines to which the output terminals are connected include a switch arrangement capable of disconnecting the DC bias voltage, and the respective DC bias voltage supply line to which the input terminal is connected is itself connected to a variable DC bias voltage supply capable of being controlled to provide a normal DC bias voltage or a high DC bias voltage. The control of the switch arrangement and the variable DC voltage may be provided by a control circuit that forms part of a power amplifier module together with the power amplifier.

Such selective shorting out of one or more of the power amplifier devices allows the power amplifier to accommodate variation in the output voltage of a power supply such as a battery, in particular the discharge characteristic over the discharge thereof. In particular, the number of power amplifier devices shorted out may be higher when the voltage is high and may be reduced to introduce more power amplifier devices when the DC supply voltage reduces. By way of example, in order to provide nominal overall voltage of 7V in a power amplifier consisting of a series stack of three transistors, if the power supply voltage is greater than 3.5V then a single power amplifier device may be shorted out and when the output voltage of the power supply reduces below 3.5V, then no power amplifier devices may be shorted out.

Such shorting out of power amplifier devices allows the overall efficiency to be improved because the individual power amplifier devices may be operated with generally smaller excess bias voltages. It is also possible to use a power supply, such as a battery, along a greater portion of the discharge characteristic to a lower final voltage before the battery is considered to be discharged. This improves the effective battery life.

The selective shorting out of the at least one of the power amplifier devices may be performed in response to either the DC supply voltage supplied to the power amplifier or the output power of transmission. Accordingly, there is further provided according to the first aspect of the present invention a similar method of controlling a power amplifier.

According to a second aspect of the present invention, there is provided a power amplifier for amplifying an RF input signal, the power amplifier comprising:

an amplifier input for receiving the RF input signal, and an amplifier output for outputting an amplified RF output signal;

a series stack of power amplifier devices, each arranged to amplify a signal supplied to an input terminal thereof and to generate an amplified signal across two output terminals thereof, the input terminals of each power amplifier being connected in parallel to the amplifier input for receiving the RF input signal, and the output terminals of the power amplifier devices being connected in series to the amplifier output; and a respective intermediate coupling capacitor connected between the output terminals of each adjacent pair of power amplifier devices in said series stack of power amplifier devices for DC isolation of said power amplifier devices, the output terminals of each power amplifier device being connected to respective DC bias voltage supply lines.

Thus a series stack of power amplifier devices is provided within a power amplifier. The input terminals of each power amplifier are connected in parallel to the amplifier input and so receive the same RF input signal. The output terminals of the power amplifier devices are connected in series to the amplifier output to together provide the amplified RF output signal. Thus, the power amplifier device in accordance with the present invention provides similar advantages to those discussed above with reference to Clifton et al.

In addition, an intermediate coupling capacitor is connected between the output terminals of each adjacent pair of power amplified devices in the series stack. This is for providing DC isolation of the power amplifier devices. Consequently, the output terminals of each power amplified device are connected to respective DC voltage supply lines. The DC isolation provided by the intermediate coupling capacitors allows a separate DC bias voltage supply to be provided for each power amplifier device. This means that a DC bias voltage of a reduced level is required as compared to a series stack without intermediate coupling capacitors, as in Clifton et al. This reduced requirement for the DC bias voltage is advantageous. In many practical embodiments, this allows the power amplifier to be operated from batteries without the need for a DC-DC converter, which reduces the cost and complexity of the power amplifier, whilst still providing the operational advantages from the use of a series stack of power amplifier devices.

The second aspect of the present invention is further concerned with the operation of the power amplifier in plural frequency bands, that is facilitated by the increased bandwidth of the power amplifier. In this case, it is necessary to supply the amplified RF signals output by the power amplifier selectively to supply the amplified RF signals to subsequent circuitry, typically a diplexer, of different frequency channels selectively in accordance with the RF frequency.

Typically, there is also a requirement for an impedance matching circuit to be provided between the power amplifier, which has relatively low output impedance, and the subsequent circuitry, which has relatively high input impedance. Such an impedance matching circuit generally needs to be provided outside the integrated circuit chip in which the power amplifier is implemented, because the high Q-factor requires capacitors in practical terms to be implemented by discrete components.

In a power amplifier, the switching to different frequency channels may be provided by a transmit multi-through switch arrangement, but this typically has a relatively high impedance that is greater than the output impedance of a power amplifier formed by a single power amplifier device. For this reason, the transmit multi-through switch arrangement is typically provided on the downstream side of the impedance matching circuit and, as such, in a different component from the integrated circuit chip in which the power amplifier is implemented.

However, it has been appreciated that the relatively high output impedance of the power amplifier comprising a stack of series power amplifier devices in accordance of the present invention allows the transmit multi-through switch arrangement to be connected between the amplifier output and the plural amplifier output channels that are provided for supplying amplified RF output signals of different frequencies to respective impedance matching circuits. In other words, the design of the power amplifier allows the transmit multi-through switch arrangement to be connected upstream of the power amplifier devices.

One advantage of this is that it allows the power amplifier including the transmit multi-through switch arrangement to be formed in a single integrated circuit chip, without the need to provide the transmit multi-through switch arrangement in a separate component. This reduces the complexity of the circuitry.

To allow better understanding, an embodiment of the present invention will now be described by way of non-limitative example with reference to the accompanying drawings.

DETAILED DESCRIPTION OF THE INVENTION

Figure 1:
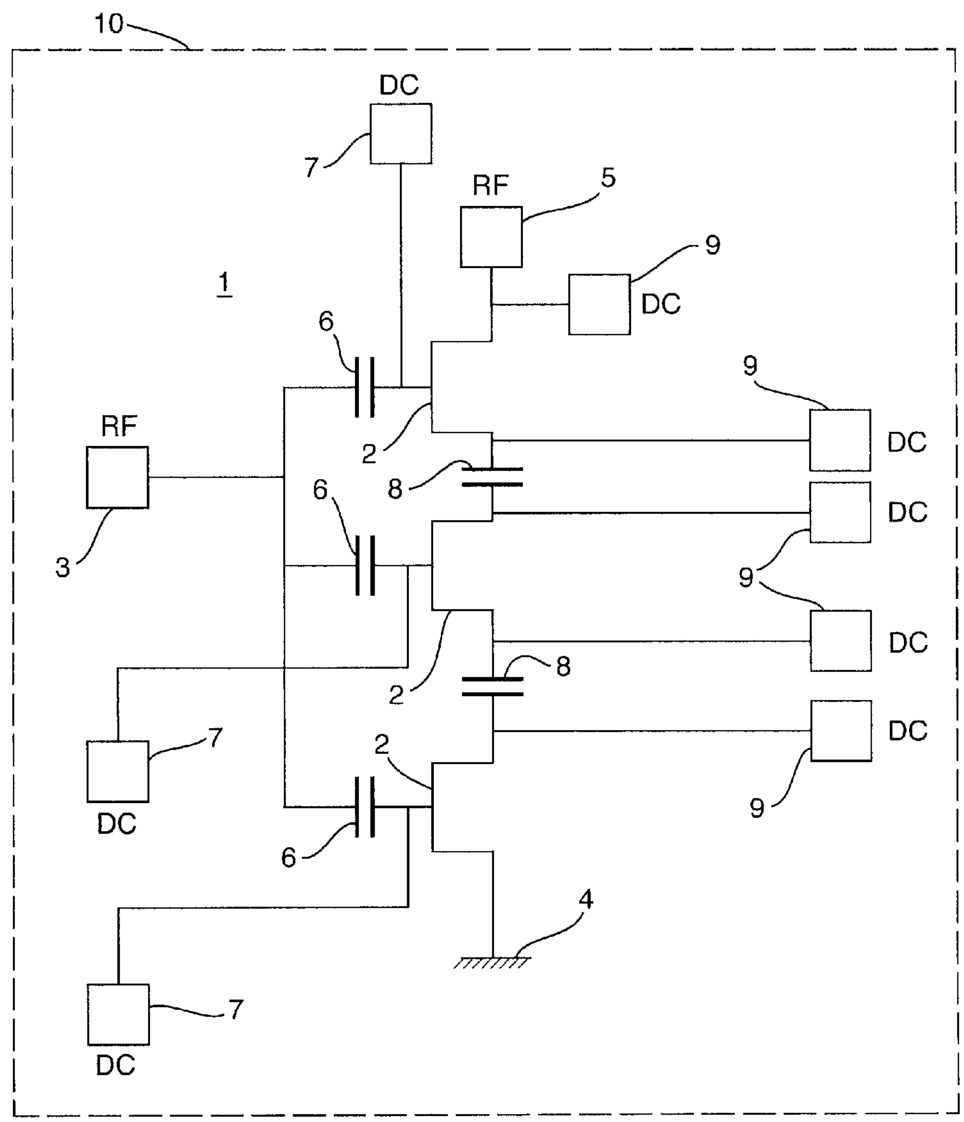
FIG. 1 is a diagram of a power amplifier.

FIG. 1 illustrates a power amplifier 1 whose components are implemented in an integrated circuit chip 10.

The power amplifier 1 comprises a series stack of transistors 2 that constitute power amplifier devices. In the examples shown in FIG. 1, the power amplifier 1 includes three transistors 2. However, this is merely by way of example and in general the power amplifier 1 may include any plural number of transistors 2. In this example, the transistors 2 are junction pseudomorphic high electron-mobility transistors (JPHEMTs). This technology exhibits several attractive characteristics compared to alternative power amplifier devices, such as having a high Gm at turn-on and a linear Gm/bias characteristic.

The power amplifier 1 also has an amplifier input 3 for receiving a radio frequency (RF) input signal. The gates of the individual transistors 2, that act as input terminals thereof, are connected in parallel to the amplifier input 3 so that the transistors 2 each receive the RF input signal. In operation, each transistor 2 amplifies the RF input signal supplied thereto, and generates an amplified RF signal across its drain and source that act as the output terminals of the transistor 2.

The transistors 2 are arranged in a series stack with the gate and source of each transistor 2 being connected in series between a ground terminal 4 and an amplifier output 5 of the power amplifier 1. Due to this series arrangement, the amplified RF signals generated by each individual transistor 2 sum to provide the amplified RF output signal of the power amplifier 1 at the amplifier output 5. As compared to a power amplifier formed by a single transistor 2, this provides a number of advantages as follows. The relatively high overall drive voltage increases the bandwidth of the power amplifier 1. In practical applications in a portable telecommunications device, this may increase the number of bands for which the power amplifier 1 is capable of providing amplification. The series stack of transistors 1 also improves the efficiency by providing a high gain and allowing operation at a higher voltage than for a single transistor, further from the knee voltage (being the drain or collector voltage at which the I/V characteristic of the device moves from a steep to a flat gradient and which is in practice the minimum useable voltage at which a power amplifier can be operated in order to achieve finite output power). The power amplifier 1 may also be implemented in a reduced semiconductor area of integrated circuit chip, because the higher voltage operation provides a higher output power per unit area of the geometry of the transistors 2.

The power amplifier 1 includes respective input coupling capacitors 6 connected between the amplifier input 3 and the gate of each transistor 2. The connection of the amplifier input 3 in parallel to the gate of each transistor 2 results in loops being formed through the transistors 2 in the series stack and their input terminals, via the common connection to the amplifier input 3. There is a risk that during operation such loop oscillations around such loops can deteriorate the frequency response of the power amplifier 1. The purpose of the input coupling capacitors 6 is to reduce such loop oscillations.

As such, the capacitance of the input coupling capacitors 6 is chosen to provide a sufficiently high impendence to the RF signal as compared to the gain around the loops. In particular, the capacitance is chosen so that the total impedance of the input coupling capacitor 6 and the linkage capacitance of the transistor between its gate and source are above the gain of the transistor. However, provided that the loop oscillations are sufficiently suppressed, the capacitance of the input coupling capacitor 6 is chosen to be as high as possible for optimising the RF properties of the power amplifier 1. This is because a low capacitance degrades the Q-factor of the power amplifier 1 and so the capacitance should be sufficiently high that the Q-factor is low enough to limit loss of gain. Furthermore, a low capacitance increases the input impedance of the power amplifier and so the capacitance should be as high as possible to reduce the impedance matching requirements of the RF input signal. For example, in the case that the transistors 2 are JPHEMTs having an area of 4 mm (10×400 μm), then the input coupling capacitors 6 may typically have a capacitance of around 1 pF.

In addition, respective DC bias voltage supply line 7 is connected to the gate of each transistor 2, for supply, in operation, of a DC bias voltage. The DC bias voltage supply lines 7 are therefore connected directly to the gates of the transistors, that is between the input coupling capacitor 6 and the gates of the transistors 2.

In addition, respective intermediate coupling capacitors 8 are connected intermediate each pair of transistors 2 in the series stack, that is connected between the drain of one transistor 2 and the source of an adjacent transistor 2. The purpose of the intermediate coupling capacitors 8 is to provide DC isolation between the transistors 2. Consequently, the drain and source of each transistor 2 are connected to respective DC bias voltage supply lines 9 for supplying separate DC bias voltages to each of the transistors 2.

Thus, the intermediate coupling capacitors 8 allow the transistors 2 to be biased in parallel even though they are arranged in a series stack to increase the voltage of the amplified RF output signal. This provides a significant advantage of reducing the magnitude of the DC bias voltages required. For example, it may avoid the need for a DC-DC converter to increase the voltage supplied by a power supply such as a battery. For example, in a portable telecommunications device, power is typically supplied by a battery whose voltage is limited by the battery technology used, typically being around 3-4V. The transistor 2 may be configured to operate with a bias voltage that is available from the battery. In this manner, the advantages of the series stack of transistors 2 in the power amplifier 1 may be achieved without the need for DC-DC conversion to provide a high voltage across the entire stack. Avoidance of a DC-DC converter reduces the complexity of the power amplifier 1.

The capacitance of the intermediate coupling capacitors 8 is chosen to be as high as possible to reduce their impendence to the RF signals generated across the series stack of transistors 2. The capacitance is selected to be high relative to the output impedance of the amplifier output impedance of the transistors 2, preferably being at least in order of magnitude smaller. However, there are practical limits on the capacitance of the intermediate coupling capacitors 8 within the integrated circuit chip 10. One practical limit is the resultant physical size of the integrated circuit chip 10 which should not be excessive. Another practical limit is that it is desirable for the dimensions of the intermediate coupling capacitors 8 to be below around a tenth of the wavelength of the RF signals in order to avoid interference effects. Where the transistors 2 are formed as JPHEMTs of size 4 mm (10×400 μm), then the intermediate coupling capacitors 8 might typically have a capacitance of around 50 pF.

Figure 2:
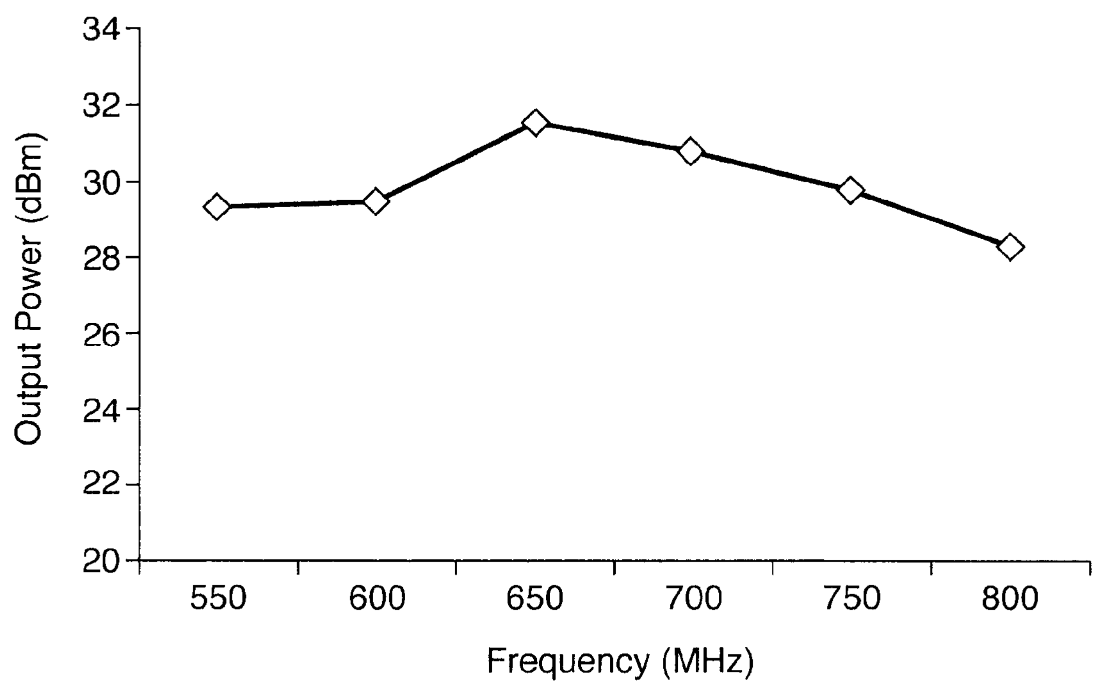
FIG. 2 is a graph of the output power of a power amplifier against frequency.

FIG. 2 is a graph of the output power against frequency for an example of the power amplifier 1 illustrated in FIG. 1, but with only two transistors 2. In this example, the drain voltage is 4.6V and the input power is 20.2 dBm. Furthermore, no printed circuit board losses were taken into account and the power amplifier 1 was operated with no input impedance matching and with only low frequency, low Q-factor components for output impedance matching. Nonetheless, the graph shows a good performance for the power amplifier 1.

Figure 3:
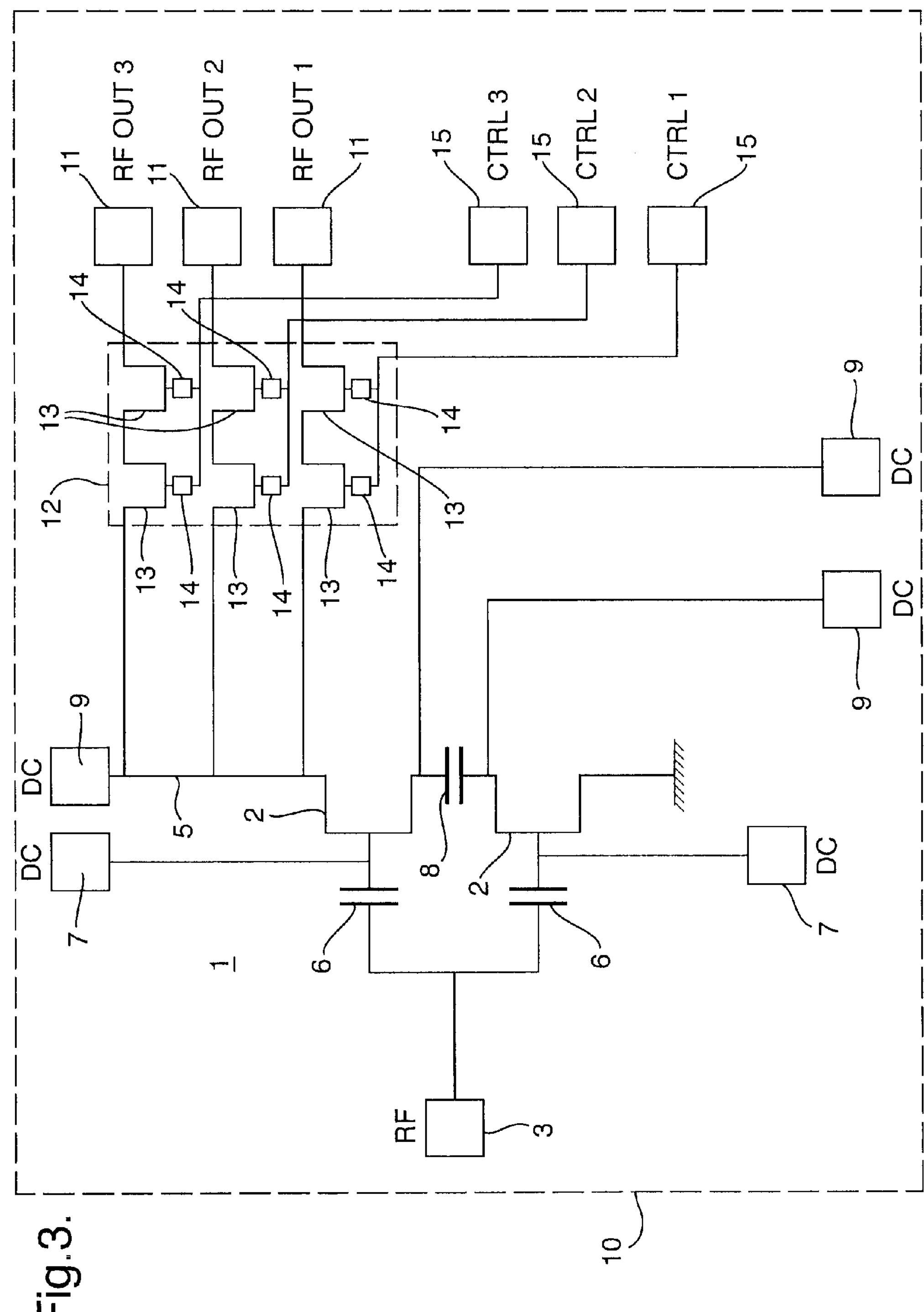
FIG. 3 is a diagram of a power amplifier including a multi-through transmit switch arrangement.

As previously mentioned, one of the advantages of the series stack of transistors 2 in the power amplifier 1 is that the bandwidth of the power amplifier 1 is increased as compared to the use of a single transistor. Whereas a power amplifier in a portable telecommunications device will often be restricted to use with a single frequency band, the increased bandwidth allows the power amplifier 1 to be used with multiple RF bands. Thus, there is a need to switch the amplified RF output signal to different circuitry for the different bands depending on the frequency. FIG. 3 illustrates a modification of the power amplifier 1 to achieve this. The power amplifier 1 shown in FIG. 3 is identical to that shown in FIG. 1 with two transistors 2, but modified to include the following additional components.

The power amplifier 1 includes three amplifier output channels 11 that are connected to the amplifier output 5 through a transmit multi-through switch arrangement 12. Although three amplifier output channels 11 are illustrated in this example, in general there may be any plural number of amplifier output channels 11 equal to the number of frequency bands in which the power amplifier 1 is to operate. The transmit multi-through switch arrangement 12 consists, in respect of each of the amplifier output channels 11, a pair of switch devices 13 connected between the amplifier output 5 and the amplifier output channel 11. In this example, the switch devices 13 are simple field effect transistors, for example having a size of 2 mm (5×400 μm). The pair of switch devices 13 in respect of each amplifier output channels 11 are connected through a gate resistor 14 (for example of 2kΩ) to a respective control terminal 15. However, the any other suitable switch arrangement could be used.

By supply of appropriate control signals to the control terminals 15 to switch the switch devices 13, the transmit multi-through switch arrangement 12 may be switched to supply the amplified RF output signal from the amplifier output 5 to any selected one of the amplifier output channels 11. In operation, the switching is performed in accordance with the frequency of the RF input signal to supply the amplifier RF output signal to a corresponding amplifier output channel 11.

Thus, the multi-through switch arrangement 12 has been implemented in the same integrated circuit 10 has the rest of the power amplifier 1. This is achievable because of the provision of the power amplifier 1 as a series stack of transistors 2. In particular, the power amplifier 1 has a relatively high output impedance enabling the transmit multi-through switch arrangement 12 to be connected directly to the amplifier output 5 without any intermediate impedance matching circuit.

In contrast, in some existing power amplifiers, the output impedance does not permit this, thereby requiring a transmit multi-through switch arrangement to be provided after an impedance matching circuit for the purpose of impedance matching between the power amplifier 1 and the subsequent circuitry in respect of the given frequency band. As an impedance matching circuit would typically need to be implemented outside the integrated circuit chip 10, due to the need to utilise discrete capacitor and inductor components, this requires the transmit multi-through switch arrangement to be provided in a separate integrated circuit chip.

There will now be considered the DC bias voltage supplies. In a simple arrangement, each transistor 2 may be connected to a common DC bias voltages. In this case, the respective DC bias voltage supply line 7 connected to a gate of a transistor are connected to the same DC bias voltage. For example, the DC bias voltage may be provided in a conventional manner from a bias control loop connected to each of the DC bias voltage supply line 7. Similarly, the respective DC bias voltage supply lines 9 connected to the source and drain, respectively, of the transistors 2 are connected across a common DC bias voltage supplied directly from a power supply, such as a battery, or from an envelope tracking/modulation unit.

Figure 4:
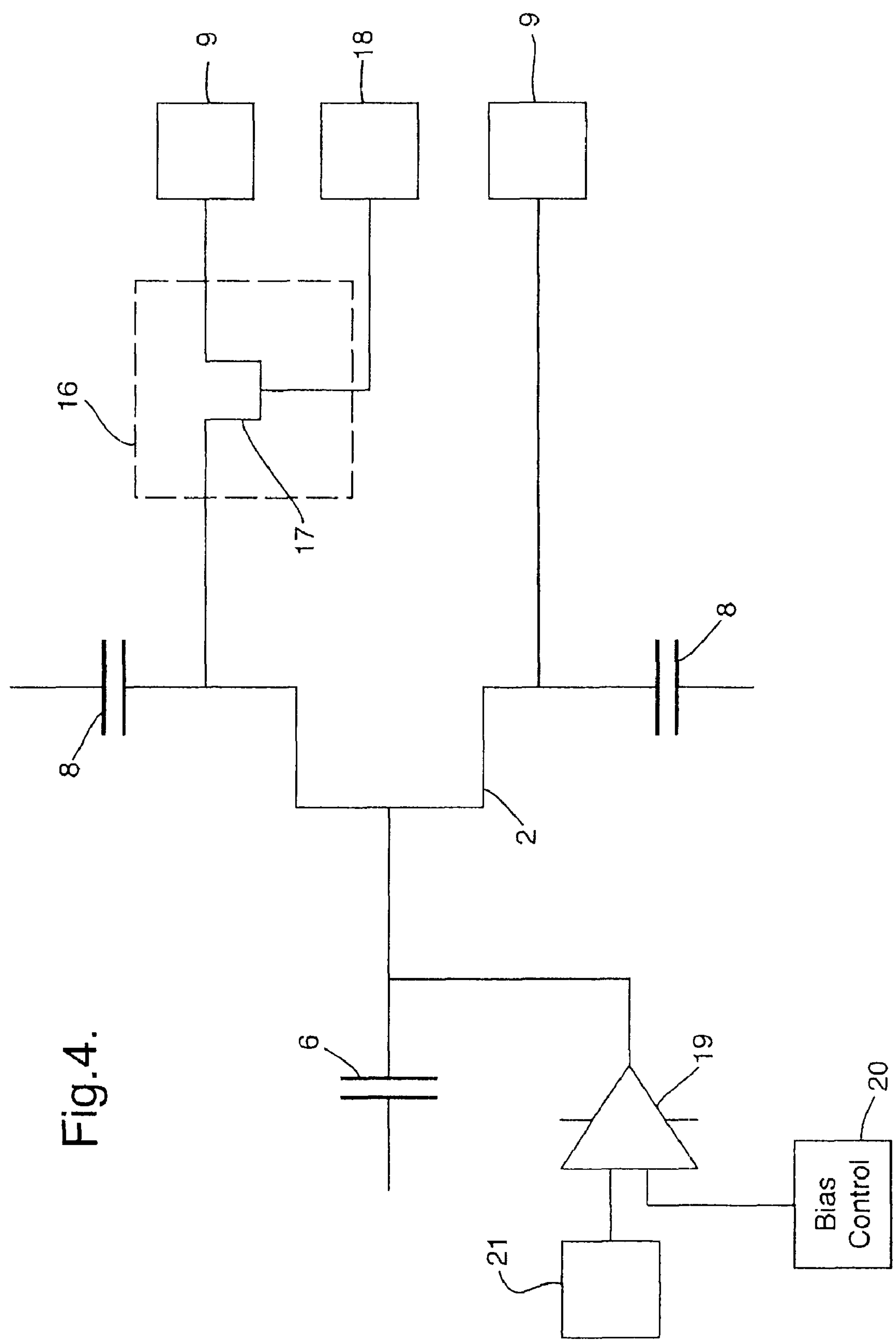
FIG. 4 is a diagram of a transistor of the power amplifier having a controllable DC bias voltage for shorting out the transistor.

However, in an alternative arrangement, the DC bias voltages supplied to at least one of the transistors may be controlled to short out the transistor 2 concerned. FIG. 4 illustrates a single transistor 2 having an example of such an alternative arrangement. This arrangement may be applied to any one or more of the transistors 2 in the power amplifier 1.

In this example, the DC bias voltage supply lines 9 include a switch arrangement 16 that is capable of disconnecting the DC bias voltage supplied by the DC bias voltage supply lines 9 to the transistor 2. In particular, the switch arrangement 16 comprises a switch device 17 connected between the source of the transistor 2 and the corresponding one of the DC bias voltage supply lines 9. The switch device 17 is in this example formed by a simple field effect transistor. The gate of the switch device 17 is connected to a control terminal 18 for supplying a control signal capable of closing and opening the switch device 17, thereby connecting and disconnecting the DC bias voltage applied through the DC bias voltage supply lines 9 across the source and drain of the transistor 2.

In addition, the gate of the transistor 2 is connected to an operational amplifier 19 that operates as a variable DC bias voltage supply. One input of the operational amplifier 19 is supplied with a bias control voltage from a bias control loop 20 of a conventional construction. The bias control loop 19 provides the normal DC bias voltage required for the transistor 2 to operate normally. The other input of the operational amplifier 19 is connected to a control terminal 21 for supply a control signal that is capable of switching the operational amplifier 19 between state in which it outputs the normal DC bias voltage supplied from the bias control loop 20 and a state in which it outputs a high DC bias voltage. That high DC bias voltage is sufficiently high to short out the transistor 2 when the bias voltage supplied across the source and drain by the DC bias voltage supply lines 9 is disconnected.

In operation, the switch arrangement 16 and the operational amplifier 19 are controlled by the control signals supplied to the control terminals 18 and 21 to selectively operate the transistor 2 normally or to short out the transistor 2. This control may be performed using the circuitry shown in FIG. 5 which illustrates a power amplifier module 30 including the power amplifier 1 implemented in the integrated circuit chip 10.

The power amplifier module 30 includes a control circuit 31 that provides control signals to the integrated circuit chip 10 for controlling the power amplifier 1. The power amplifier module 30 is powered by a battery 32 that constitutes a power supply for the power amplifier 1 and also the other components of the power amplifier module 30. The voltage supplied by the battery 32 is monitored by a sensor circuit 33. The output of the sensor 33 representing the monitored voltage is supplied to the control circuit 31 which controls the switch arrangement 16 and the operational amplifier 19 in response thereto.

Figure 6:
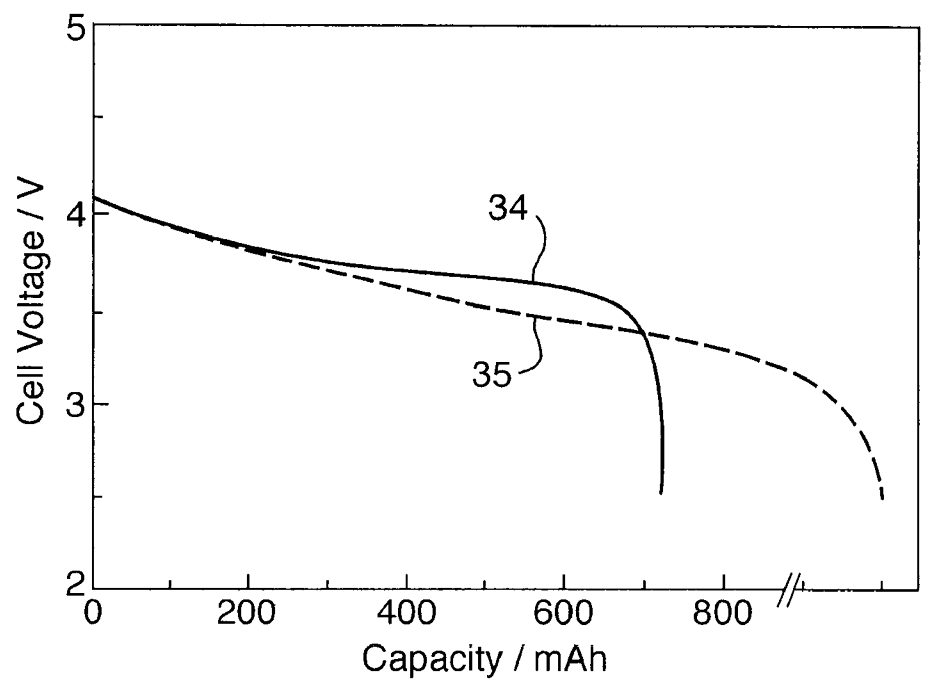
FIG. 6 is a graph of the discharge characteristic of a battery.

The control circuit 31 effects a control having regard to the discharge characteristic of the battery 32 as will now be described. The discharge characteristic is characterised by the voltage supplied by the battery 32 reducing as the battery 32 discharges. By way of example, FIG. 6 is a graph of output voltage against capacity showing a discharge characteristic 34 for a typical carbon-electrode Li-ion battery and a discharge characteristic 37 for an example of a or recently developed alloy-electrode Li-ion battery. Both discharge characteristics 34 and 35 show how the voltage drops around 4.2 volts dropping steadily at first and then dropping steeply when the battery 32 approaches complete discharge. Typically the power amplifier 1 is configured to operate at a nominal output voltage, for example 3.5V or 3V. However, when the output voltage is above this nominal voltage then the power corresponding to the actual output voltage in excess of the nominal output voltage is wasted to the detriment of efficiency. Conversely, when the output voltage falls below the nominal output voltage then the battery 32 is taken to have run out of power and operation is stopped. The nominal output voltage is typically set as a compromise between increasing the efficiency and increasing the battery lifetime.

However, the control circuit 1 is operable to allow a better compromise to be achieved by selective shorting out of one or more the transistors 2. In particular, when the voltage of the battery 32 is high, then one or more of the transistors 2 are shorted out so that the entire amplified RF output signal is derived from only the remaining transistors 2. However, as the voltage is high, it is still possible to obtain the desired output power. Subsequently, when the voltage of the battery 32 reduces, the transistors 2 are controlled so that a lesser number of transistors 2 is shorted out until all the transistors 2 are being used. This provides extra power to the amplified RF output signal when the voltage from the battery reduces. By way of example, in order to provide a nominal overall voltage of 7 volts when the power amplifier 1 consists of a series stack of three transistors 2. When the power supply voltage is greater than 3.5 volts then a single transistor 2 is shorted out to leave two transistors 2 operating, but when the output voltage of the power supply reduces below 3.5V then no transistors 2 are shorted out so that all the transistors 2 are operating.

This switching allows a better compromise between the efficiency of the power amplifier 1 and the life of the battery 32, because the individual transistors 2 may be operated with a smaller margin between the nominal operating voltage and the actual voltage, by simply reducing the number of transistors 2 when the supply voltage is relatively high. Conversely, it is possible to use the battery 32 along a greater portion of the discharge characteristic to a lower final voltage before the battery 32 is considered to have discharged.

Figure 5:
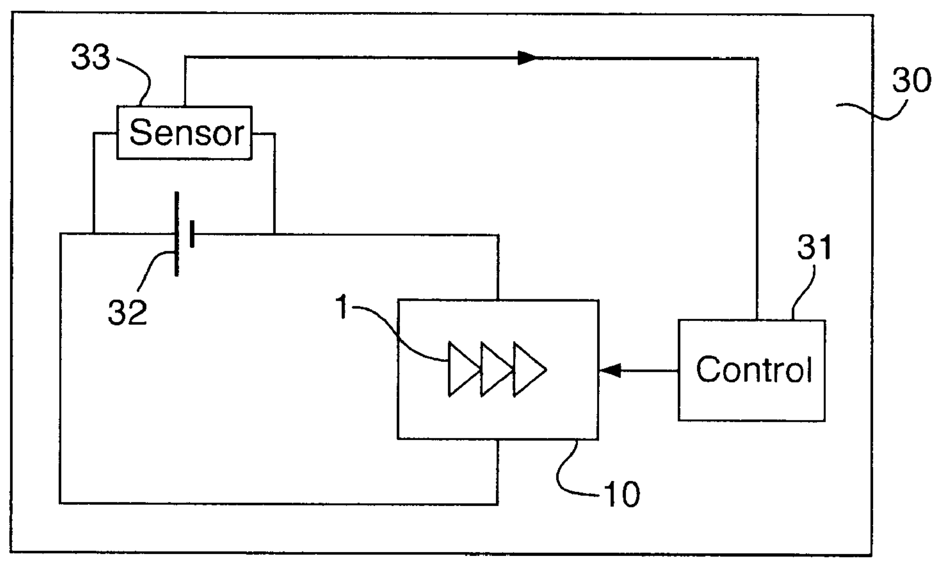
FIG. 5 is a diagram of a power amplifier module including the power amplifier and a control circuit.

The control circuit 31 in FIG. 5 could also take account of the output power at transmission is required to be made. The time-averaged output power is adjusted according to how far it is from the base station terminal. Thus, the input power to the power amplifier or a control voltage associated with the power amplifier is usually adjusted (via commands from the communications processor of the portable telecommunication device) in order to vary the output power from the power amplifier (i.e. the power control range, which is typically around 30 dB to 80 dB depending upon communications standard). The transistors 2 may be progressively shorted at lower than maximum output power levels in order to reduce dc power consumption and thus increase efficiency. Sufficient transistors need to be operating within the stack to provide the required output power but any others can be shorted to reduce dc consumption. The instantaneous power level of the modulation envelope may be used to progressively short the transistors 2 in exactly the same way. The use or otherwise of envelope tracking will impact the design of the control circuit 31.

Figure 7:
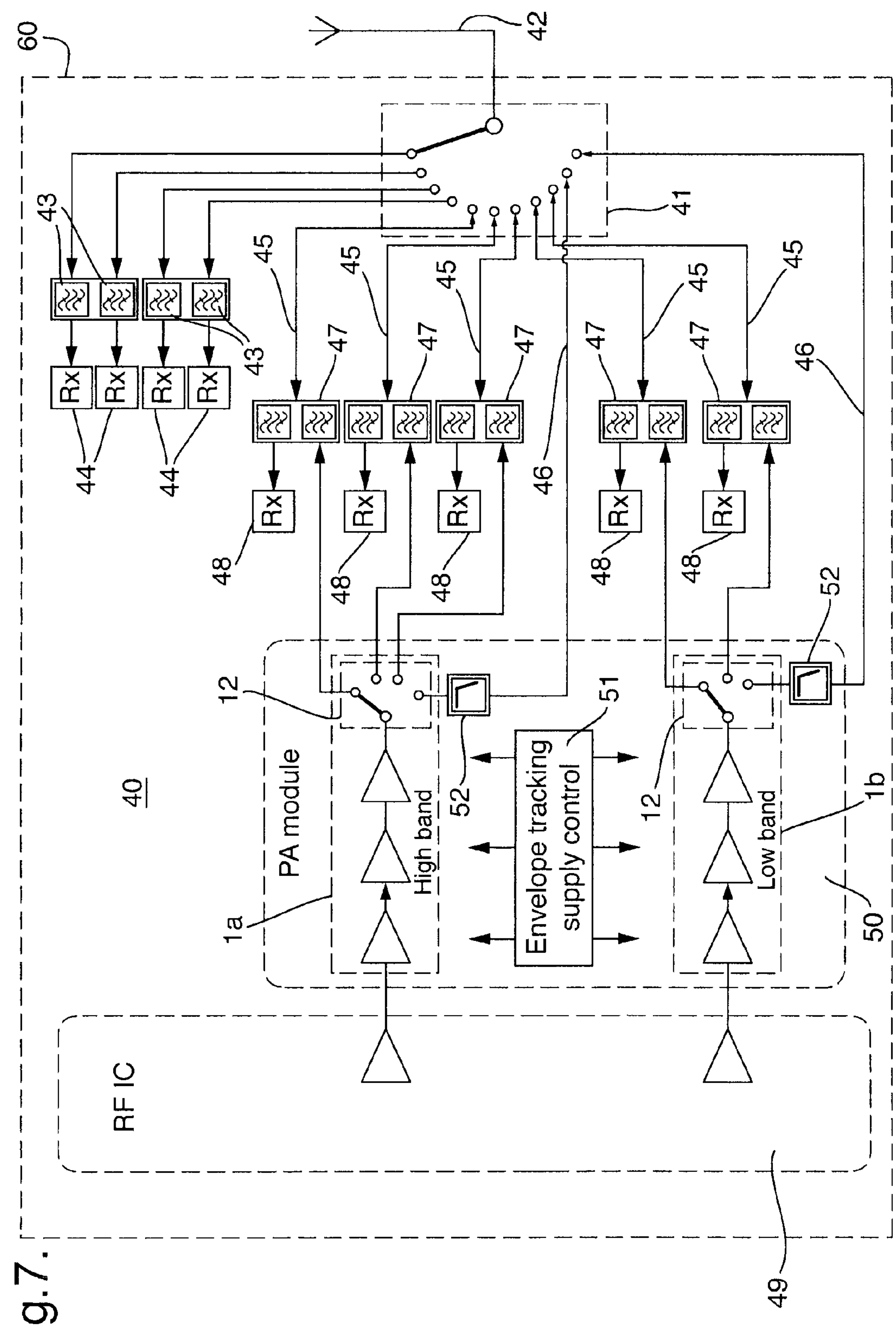
FIG. 7 is a system block diagram of the transceiver circuit of a portable telecommunications device.

FIG. 7 is a system block diagram of a transceiver circuit in which the power amplifier 1 described above is utilised, incorporated in a portable telecommunication device 60 that may be of any type, for example a mobile telephone. The transceiver circuit 40 may be incorporated in a portable telecommunications device, for example a mobile telephone, to provide transmission over four GSM bands and five WCDMA/LTE bands. The transceiver circuit includes a multi-way switch arrangement 41 that is connected to an antenna 42 and provides switching between the antenna 42 and a selective one of eleven terminals. Four of the terminals of the multi-way switch arrangement 41 are connected through bandpass filters 43 to reception circuits 4 for the GSM bands. The remaining terminals of the multi-way switch arrangement 41 are connected to five channels 45 for the WCDMA/LTE bands and to two channels 46 for GSM transmission. The channels 45 for the WCDMA/LTE bands are each connected to a respective diplexer 47 that separates received signals and transmitted signals. In particular, received signals supplied from the antenna 42 are transferred by the diplexers 47 to respective WCDMA/LTE reception circuits 48, whereas transmission signals pass in the opposite direction through the diplexers 47 to the antenna 42.

The transmission signals are generated as follows. The transceiver circuit 40 includes an RF integrated circuit 49 that generates RF signals in the various frequency bands and supplies them to a power amplifier module 50 that comprises two power amplifiers 1, each of which is arranged as shown in FIG. 3 and described above.

Each of the power amplifiers 1 has sufficient bandwidth to amplify signals in plural RF bands. In particular, the first power amplifier 1*a* which is supplied with signals in three WCDMA/LTE bands (namely 3GPP band 7, 2500-2570 MHz; 3GPP band 1, 1920-1980 MHz; and 3GPP band 2, 1850-1900 MHz), as well as signals in an upper frequency GSM band (namely GSM/EDGE, 170-1910 MHz). Similarly, the second power amplifier 1*b* is supplied with RF input signals in two WCDMA/LTE bands (namely 3GPP band 8, 880-915 MHz; and 3GPP band 5, 824-849 MHz) and a lower frequency GSM band (namely GSM/EDGE 824-915 MHz).

The power amplifiers 1*a* and 1*b* amplify the RF input signals in the respective bands to provide amplified RF output signals. The power amplifier module 50 includes an envelope tracking supply control circuit 51 that monitors the envelope of the RF input signal and in response thereto dynamically changes the supply voltages supplied to the power amplifiers 1*a* or 1*b* that is currently operating. In particular, the supplied power supply voltage is modulated in synchronisation with the envelope of the RF input signal to ensure that the transistors 2 within the power amplifiers 1 stay in saturation. This improves the power efficiency of the amplifiers 1*a* and 1*b*, although a conventional fixed DC supply could be used as an alternative to the envelope tracking supply control circuit 51 shown in FIG. 7, albeit with lower efficiency.

The amplified RF output signal is supplied through a transmit multi-through switch arrangement 2 that is switched in accordance with the RF frequency of the RF input signal to transmit the amplified RF signal along the appropriate channel. In particular, the amplified RF output signals in the GPP bands are supplied to the appropriate diplexer 47 for supply to the GPP channels 45, whereas the amplified RF output signals in the GSM bands are supplied through respective lowpass filters 52 to the respective GSM channels 46.

Thus, the transceiver circuit 40 shown in FIG. 7 is implemented with a requirement for only two power amplifiers 1*a* and 1*b*. In contrast, if the transceiver circuit 40 was implemented using power amplifiers formed by a single transistor, then it would probably be necessary to provide five power amplifiers for the five GPP bands and two power amplifiers for the GSM bands. Thus, the transceiver circuit 40 is simplified and the cost of the circuit is reduced.

Although the power amplifier 1 described above uses JPHEMT transistors, in general, any type of power amplifier device could in principle be used. Advantageously, the power amplifier devices are field effect transistors. This facilitates the provision of control for shorting out the power amplifier devices as described above, because field effect transistors can be shorted with a low impedance by control of the bias voltage supplied thereto. However, not withstanding this point, the power amplifiers 1 could be modified to use bipolar transistors instead. The present invention is particularly suitable for application to field effect transistors that employ III-V materials, and especially high electron mobility transistors, for example PHEMPT or JPHEMPT devices. However, the invention could equally be implemented using power amplifier devices that employ silicon technology.

The invention claimed is:

1. A power amplifier for amplifying an RF input signal, the power amplifier comprising:

an amplifier input for receiving the RF input signal, and an amplifier output for outputting an amplified RF output signal;

a series stack of power amplifier devices, each arranged to amplify a signal supplied to an input terminal thereof and to generate an amplified signal across two output terminals thereof, the input terminals of each power amplifier being connected in parallel to the amplifier input for receiving the RF input signal, and the output terminals of the power amplifier devices being connected in series to the amplifier output; and a respective intermediate coupling capacitor connected between the output terminals of each adjacent pair of power amplifier devices in said series stack of power amplifier devices for DC isolation of said power amplifier devices, the output terminals of each power amplifier device being connected to respective DC bias voltage supply lines, and wherein, in respect of at least one of the power amplifier devices, the respective DC bias voltage supply lines to which the output terminals are connected include a switch arrangement capable of disconnecting the DC bias voltage, and the respective DC bias voltage supply line to which the input terminal is connected is itself connected to a variable DC bias voltage supply capable of being controlled to provide a normal DC bias voltage or a high DC bias voltage.

2. A power amplifier according to claim 1, wherein the power amplifier devices are field effect transistors.

3. A power amplifier according to claim 2, wherein the power amplifier devices are field effect transistors that employ III-V materials.

4. A power amplifier according to claim 3, wherein the power amplifier devices are high electron mobility transistors.

5. A power amplifier according to claim 1, wherein the power amplifier further comprising a plurality of amplifier output channels for outputting amplified signals of different RF frequencies to respective impedance matching circuits and a transmit multi-through switch arrangement connected between said amplifier output and said plurality of amplifier output channels for supplying the amplified signal to one of the amplifier output channels in accordance with its RF frequency.

6. A power amplifier according to claim 5, wherein the power amplifier, including the transmit multi-through switch arrangement, is formed in an integrated circuit chip.

7. A power amplifier according to claim 1, further comprising a respective input coupling capacitor connected between the amplifier input and the input terminal of each power amplifier device for reducing loop oscillations around loops formed through power amplifier devices in the series stack and their input terminals, the input terminal of each power amplifier device being connected to a respective DC bias voltage supply line.

8. A power amplifier according to claim 1, wherein said variable DC bias voltage supply is an operational amplifier.

9. A power amplifier module capable of use with a power supply providing a variable DC supply voltage, comprising:
a power amplifier according to claim 1; and
a control circuit arranged to control the switch arrangement and the variable DC bias voltage supply, the control circuit being arranged to selectively short out said at least one of the power amplifier devices by controlling the switch arrangement to disconnect the DC bias voltage supplied to the output terminals and to control the variable DC bias voltage supply to provide a high DC bias voltage.

10. A power amplifier module according to claim 9, wherein the control circuit is arranged to monitor the DC supply voltage of the power supply, and to selectively short out said at least one of the power amplifier devices in response to the monitored DC supply voltage.

11. A power amplifier module according to claim 9, wherein the control circuit is arranged to selectively short out said at least one of the power amplifier devices in response to the output power of transmission.

12. A portable telecommunication device including a power amplifier according to claim 1.

13. A portable telecommunication device including a power amplifier according to claim 9.

14. A method of controlling a power amplifier that comprises:
an amplifier input for receiving the RF input signal, and an amplifier output for outputting an amplified RF output signal;
a series stack of power amplifier devices, each arranged to amplify a signal supplied to an input terminal thereof and to generate an amplified signal across two output terminals thereof, the input terminals of each power amplifier being connected in parallel to the amplifier input for receiving the RF input signal, and the output terminals of the power amplifier devices being connected in series to the amplifier output; and
a respective intermediate coupling capacitor connected between the output terminals of each adjacent pair of power amplifier devices in said series stack of power amplifier devices for DC isolation of said power amplifier devices, the output terminals of each power amplifier device being connected to respective DC bias voltage supply lines,
the method comprising selectively shorting out at least one of the power amplifier devices in response to either the DC supply voltage supplied to the power amplifier or the output power of transmission.

15. A power amplifier for amplifying an RF input signal, the power amplifier comprising:
an amplifier input for receiving the RF input signal, and an amplifier output for outputting an amplified RF output signal;
a series stack of power amplifier devices, each arranged to amplify a signal supplied to an input terminal thereof and to generate an amplified signal across two output terminals thereof, the input terminals of each power amplifier being connected in parallel to the amplifier input for receiving the RF input signal, and the output terminals of the power amplifier devices being connected in series to the amplifier output;
a respective intermediate coupling capacitor connected between the output terminals of each adjacent pair of power amplifier devices in said series stack of power amplifier devices for DC isolation of said power amplifier devices, the output terminals of each power amplifier device being connected to respective DC bias voltage supply lines; and
a plurality of amplifier output channels for outputting amplified signals of different RF frequencies to respective impedance matching circuits and a transmit multi-through switch arrangement connected between said amplifier output and said plurality of amplifier output channels for supplying the amplified signal to one of the amplifier output channels in accordance with its RF frequency.

16. A power amplifier according to claim 15, wherein the power amplifier, including the transmit multi-through switch arrangement, is formed in an integrated circuit chip.

* * * * *